United States Patent [19]

Banno et al.

[11] Patent Number: 5,246,610
[45] Date of Patent: Sep. 21, 1993

[54] PIEZOELECTRIC COMPOSITE MATERIAL

[75] Inventors: Hisao Banno; Kohji Ogura, both of Nagoya, Japan

[73] Assignee: NGK Spark Plug Co., Ltd., Aichi, Japan

[21] Appl. No.: 803,482

[22] Filed: Dec. 2, 1991

[30] Foreign Application Priority Data

Dec. 10, 1990 [JP] Japan .................................. 2-409974

[51] Int. Cl.$^5$ ...................... H04R 17/00; C04B 35/00
[52] U.S. Cl. ................................. 252/62.9; 310/337; 367/157; 428/212; 428/323; 428/327; 428/328
[58] Field of Search .................. 252/62.9 R; 367/157; 310/800, 334, 337; 428/323, 327, 328, 212

[56] References Cited

U.S. PATENT DOCUMENTS 4,128,489 12/1978 Seo ................................. 252/62.9 R
4,841,494 6/1989 Banno ................................. 367/157

FOREIGN PATENT DOCUMENTS 3-1488884 6/1991 Japan .

*Primary Examiner*—Jack Cooper
*Attorney, Agent, or Firm*—Darby & Darby

[57] ABSTRACT

A high $d_h$ piezoelectric composite material useful for utilization for hydrophones is disclosed which includes a matrix of an organic polymeric material and two different inorganic piezoelectric powders dispersed in the matrix. One of the piezoelectric powders has a large $|d_{31}/d_{33}|$ value, such as lead titanate zirconate, and the other piezoelecctric powder has a low $|d_{31}/d_{33}|$ value, such as lead titanate. The average particle size of one of the two piezoelectric powders is at least two times that of the other. The total amount of the two piezoelectric powders is 65–75% by volume based on the total volume of the matrix and the two piezoelectric powder. The volume ratio of the high $|d_{31}/d_{33}|$ piezoelectric powder to the low $|d_{31}/d_{33}|$ piezoelectric powder is in the range of 3:2 to 9:1.

6 Claims, 4 Drawing Sheets

5,246,610

PIEZOELECTRIC COMPOSITE MATERIAL

BACKGROUND OF THE INVENTION

This invention relates to a piezoelectric composite material useful as an under water acoustic transducer such as a hydrophone.

Piezoelectric composite materials are utilized as a receiver for converting an acoustic wave transmitted through water to an electric signal or as a transmitter for transmitting an acoustic wave to a water medium upon receipt of an alternate voltage of a predetermined frequency. In either utilization, it is desired that the composite material have a high under water piezoelectric constant $d_h$ since the higher $d_h$, the better is the S/N ratio of the piezoelectric element utilizing the composite material. The constant $d_h$ is expressed by $d_h = d_{31} + 2d_{33}$. Since $d_{31}$ generally has a negative value, $d_h$ is increased with the increase of $d_{33}$ and the decrease of $|d_{31}|$ (absolute value of $d_{31}$).

One known piezoelectric composite material includes a matrix of an organic polymeric material and a piezoelectric ceramic powder, such as lead zirconate titanate powder (hereinafter referred to as PZT) or lead titanate (hereinafter referred to as PT) powder, dispersed in the matrix. Since PZT powder has a large $d_{33}$ and a large $|d_{31}|$ while PT powder has a small $d_{33}$ and a small $|d_{31}|$, $d_h$ values of PZT and PT are small.

SUMMARY OF THE INVENTION

The present invention provides a piezoelectric composite material having an improved $d_h$ which includes a matrix of an organic polymeric material, and first and second inorganic piezoelectric powders dispersed in the matrix and having different $|d_{31}/d_{33}|$ values and different average particle sizes from each other. The first inorganic piezoelectric powder has $|d_{31}/d_{33}|$ of greater than 0.35, while the second inorganic piezoelectric powder has $|d_{31}/d_{33}|$ of not greater than 0.34. The average particle size of one of the first and second piezoelectric powders is at least twice as great as that of the other. The first and second piezoelectric powders are present in an amount of 65–75% by volume, preferably 70–75% by volume, based on the total volume of the matrix and the first and second piezoelectric powders. The volume ratio of the first piezoelectric powder to the second piezoelectric powder is in the range of 3:2 to 9:1, preferably 7:3 to 8:2.

It is an object of the present invention to provide a piezoelectric composite material having a high $d_h$.

Another object of the present invention is to provide a piezoelectric composite material useful as an under water acoustic transducer such as a hydrophone.

BRIEF DESCRIPTION OF THE INVENTION

Other objects features and advantages of the present invention will become apparent from the detailed description of the preferred embodiments of the invention which follows, when considered in light of the foregoing, in which.

DETAILED DESCRIPTION OF THE PREFERRED EMBODIMENTS OF THE INVENTION

Figure 1:
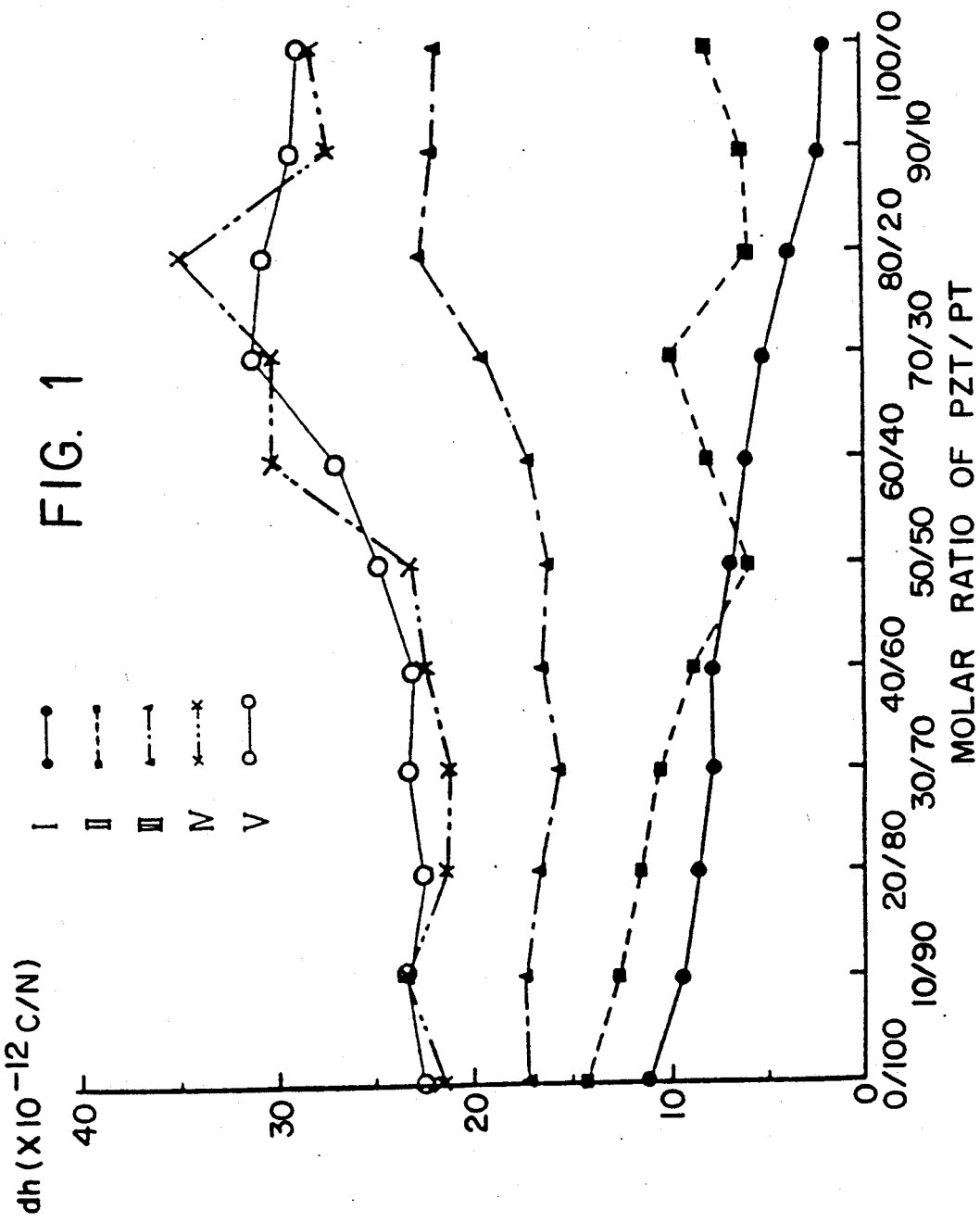
FIG. 1 is a graph showing the relationship between $d_h$ and volume ratio of PZT(7.5 μm)/PT(3.3 μm) in various ceramic contents.

The piezoelectric composite material according to the present invention includes a matrix of an organic polymeric material, and powder of first and second inorganic piezoelectric substances dispersed in the matrix and having different $|d_{31}/d_{33}|$ values and different average particle sizes from each other.

Any conventionally used organic polymeric material may be utilized as the matrix. Illustrative of suitable organic polymeric material are synthetic rubbers such as chloroprene rubbers and fluoro rubbers, and synthetic resins such as poly(vinylidene fluoride), poly(vinyl fluoride), poly(vinylidene chloride) poly(vinyl chloride) and nylon.

The first inorganic piezoelectric substance has a greater $|d_{31}/d_{33}|$ value than the second one. Generally, the $|d_{31}/d_{33}|$ value of the first inorganic piezoelectric substance is greater than 0.35 preferably greater than 0.4, while the $|d_{31}/d_{33}|$ value of the second inorganic piezoelectric substance is 0.34 or less, preferably 0.12 or less. Lead zirconate titanate (PZT) of the formula $Pb(Zr_xTi_{1-x})O_3$ (x is a number of 0.2 to 0.8) is the most preferred first piezoelectric substance. A portion of the Pb of PZT may be substituted by Ba, Sr or Ca. In addition to PZT, composite perovskite-type oxides containing barium titanate or lead magnesium niobate may also be used as the first piezoelectric substance. Lead titanate (PT) is the most preferred second piezoelectric substance. Other anisotropic ceramics such as lead metaniobate and lead metatantalate may also be used as the second piezoelectric substance. Examples of the first and second piezoelectric substances are shown in Table 1.

TABLE 1

| Composition | $|d_{31}/d_{33}|$ |
|---|---|
| First Piezoelectic Substance: | |
| $Pb(Zr_{0.52}Ti_{0.48})O_3$ | 0.419 |
| $(Pb_{0.94}Sr_{0.04})(Zr_{0.53}Ti_{0.47})O_3$ | 0.426 |
| $Pb_{0.988}(Zr_{0.52}Ti_{0.48})_{0.976}Nb_{0.024}O_3$ | 0.457 |
| $0.65Pb(Mg_{\frac{1}{3}}Nb_{\frac{2}{3}})O_3 - 0.35PbTiO_3$ | 0.428 |
| $Pb_{0.58}Ba_{0.42}Nb_2O_6$ | 0.405 |
| $(Na_{0.5}K_{0.5})NbO_3$ (hot press) | 0.401 |
| $BaTiO_3$ | 0.414 |
| Second Piezoelectric Substance: | |
| $(Pb_{0.76}Ca_{0.24}[(Co_{\frac{1}{2}}W_{\frac{1}{2}})_{0.04}Ti_{0.96}]O_3$ + 2 mole % $MnO_2$ | 0 |
| $PbTiO_3$ | 0.12 |
| $PbNb_2O_6$ | 0.106 |
| $0.96PbTiO_3 - 0.04La_{\frac{2}{3}}TiO_3$ + 1 mole % $MnO_2$ | 0.121 |
| $(Ba_{0.777}Ca_{0.133}Pb_{0.090})TiO_3$ | 0.333 |

The first and second piezoelectric powders are used in such a proportion that the volume ratio of the first piezoelectric powder to the second piezoelectric powder is in the range of 3:2 to 9:1, preferably 7:3 to 8:2. By this, $d_h$ of the resulting piezoelectric composite material can be increased as compared with the cases where the first and second piezoelectric powders are used by themselves.

The average particle size of one of the first and second piezoelectric powders is at least two times that of the other. Generally, the larger average particle size ranges from 4 to 50 μm, while the smaller one ranges from 2 to 5 μm. By the use of the two piezoelectric powders with different average particle sizes, the proportion of the piezoelectric powders relative to the matrix can be increased, so that $d_h$ and the pressure dependency of $d_h$ of the resulting piezoelectric composite material are improved. Thus, the first and second piezoelectric powders are present in an amount of 65-75% by volume, preferably 70-75% by volume, based on the total volume of the matrix and the first and second piezoelectric powders.

Figure 4:
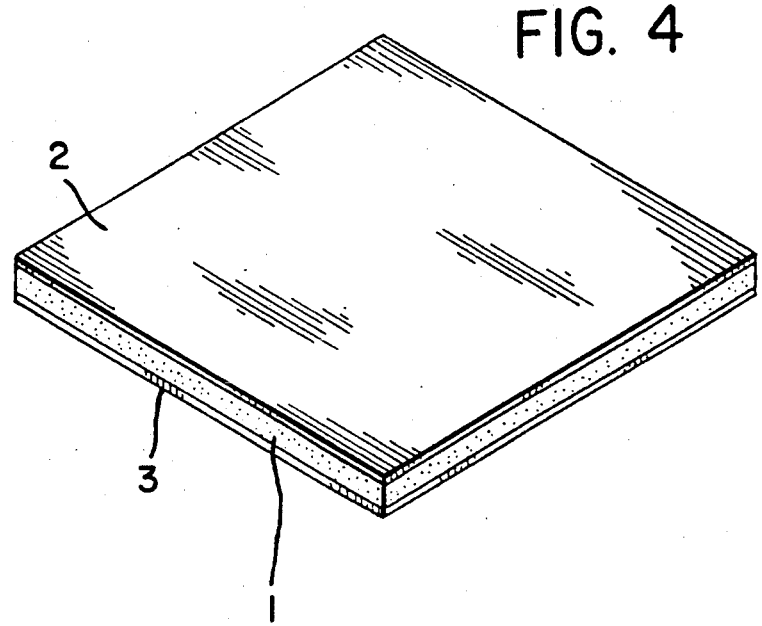
FIG. 4 is a perspective view diagrammatically showing a piezoelectric element in the form of a plate according to the present invention.
Figure 5:
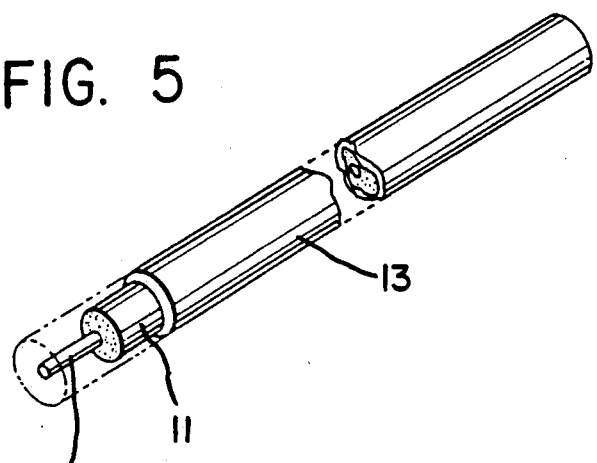
FIG. 5 is a perspective view diagrammatically showing a piezoelectric element in the form of a cable according to the present invention.
Figure 6:
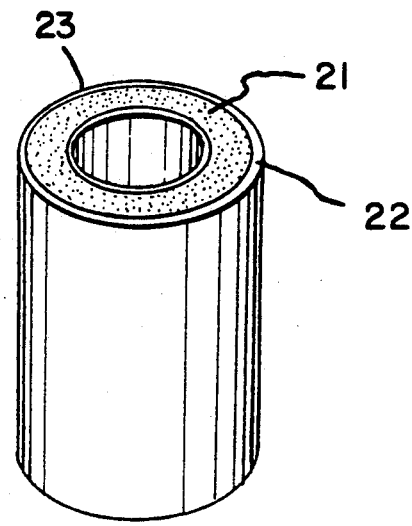
FIG. 6 is a perspective view diagrammatically showing a piezoelectric element in the form of a cylinder according to the present invention.

The piezoelectric composite material according to the present invention may be used for the fabrication of piezoelectric elements with various forms as shown in FIGS. 4 through 6. In FIG. 4, designated as 1 is a piezoelectric composite material in the form of a sheet which is sandwiched between a pair of electrode layers 2 and 3. In the embodiment shown in FIG. 5, the piezoelectric composite material is formed into a tube 11 and surrounds a coaxial core electrode 12. The tubular composite material 11 is surrounded by an outer electrode 13 to form a cable-like piezoelectric element. In the embodiment shown in FIG. 6, between an inner, tubular electrode 22 and an outer, tubular electrode 23, a tubular piezoelectric composite layer 21 is disposed to form a cylindrical piezoelectric element.

The following examples will further illustrate the present invention.

EXAMPLE 1

Preparation of PZT(2.8 μm) and PZT(7.5 μm)

Quantities of precursors or PbO, $TiO_2$, $ZrO_2$ and WO are mixed and the mixture was hydrolyzed at 940°-980° C. and then dried to form $Pb(Zr_{0.52}Ti_{0.48})O_3$ containing 5% by weight of WO. The resulting mixture was pulverized to obtain two kinds of PZT powder having average particle sizes of 2.8 μm and 7.5 μm and a $|d_{31}/d_{33}|$ value of 0.43.

Preparation of PT(3.3 μm)

Precursors of PbO and $TiO_2$ were mixed with each other and the mixture was calcined at 1000°-1100° C. The calcined product was quenched in water and then dried to obtain PT powder having an average particle size of 3.3 μm and a $|d_{31}/d_{33}|$ value of 0.12.

Preparation of Piezoelectric Element Sample Group A

PZT (7.5 μm) and PT (3.3 μm) obtained above were mixed with each other to obtain ceramic mixtures Nos. 1-11 having the PZT/PT volume ratio shown in Table 2. Each of the mixtures Nos. 1-11 was blended with chloroprene rubber in various proportions of 50, 60, 65, 70 and 75% by weight. Each blend was shaped with heat rolls (40° C.) into a sheet having a size of 140 mm × 150 mm and a thickness of 1 mm. The sheet was cured at a temperature of 170° C. and a pressure of 4 MPa for 15 minutes. An eccentrically conductive paint was applied on both sides of the cured sheet to form electrodes between which a direct current voltage of 70 KV was impressed for polarization, thereby to obtain a piezoelectric element.

TABLE 2

$d_h$ of Piezoelectic Element Sample A

| Ceramic Mixture | $d_h$ (× $10^{-12}$ C/N) Content of Ceramic Mixture (vol. %) | | | | |
|---|---|---|---|---|---|
| | I | II | III | IV | V |
| No. PZT/PT (vol) | 50 | 60 | 65 | 70 | 75 |
| 1   0:100 | 11.1 | 14.2 | 17.2 | 21.4 | 22.5 |
| 2   10:90 | 9.4 | 12.5 | 17.3 | 23.4 | 23.2 |
| 3   20:80 | 8.6 | 11.4 | 16.5 | 21.2 | 22.5 |
| 4   30:70 | 7.8 | 10.4 | 15.5 | 20.9 | 23.0 |
| 5   40:60 | 7.8 | 8.7 | 16.3 | 22.2 | 22.9 |
| 6   50:50 | 6.8 | 5.9 | 16.0 | 22.9 | 24.5 |
| 7   60:40 | 6.2 | 8.0 | 17.0 | 29.9 | 26.7 |
| 8   70:30 | 5.3 | 9.8 | 19.3 | 29.9 | 31.0 |
| 9   80:20 | 3.8 | 6.1 | 22.5 | 34.5 | 30.5 |
| 10  90:10 | 2.2 | 6.4 | 21.8 | 27.1 | 29.0 |
| 11  100:0 | 2.0 | 8.0 | 21.6 | 28.1 | 28.6 |

Preparation of Piezoelectric Element Sample Group B

PZT(2.8 μm) and PT(3.3 μm) obtained above were mixed with each other to obtain ceramic mixtures Nos. 12-22 having the PZT/PT volume ratio shown in Table 3. Using these ceramic mixtures Nos. 12-22, piezoelectric elements were prepared in the same manner as described above.

Measurement of $d_h$

Figure 2:
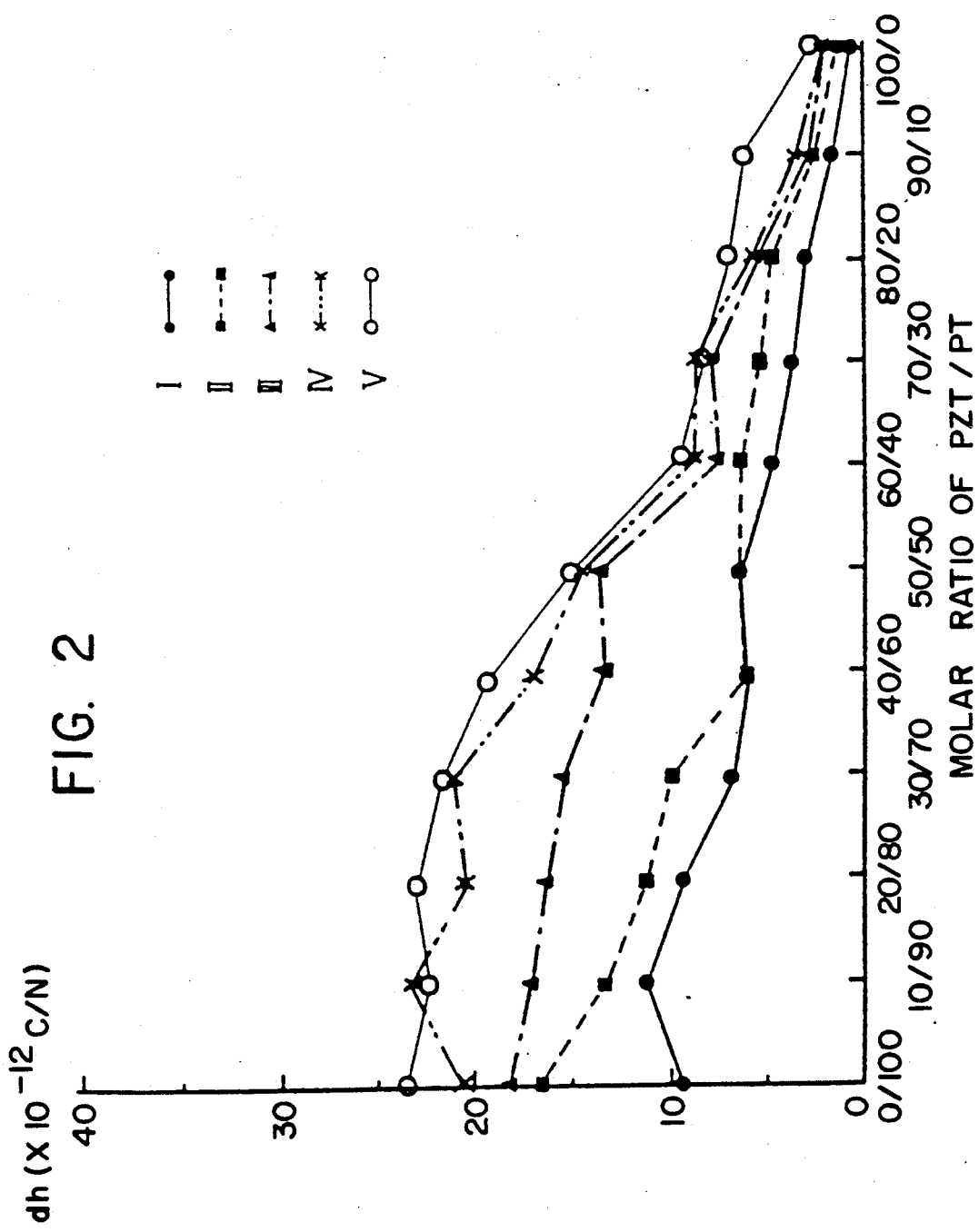
FIG. 2 is a graph, similar to FIG. 1, showing the relationship between $d_h$ and volume ratio of PZT(2.8 μm)/PT(3.3 μm) in various ceramic contents.

Sample piezoelectric element was immersed in FLUORINATE contained in a vessel. The piezoelectric constant $d_h$ was measured under ambient pressure using 40 Hz frequency. The results are summarized in Tables 2 and 3 and FIGS. 1 and 2.

Measurement of Pressure-Dependency

Figure 3:
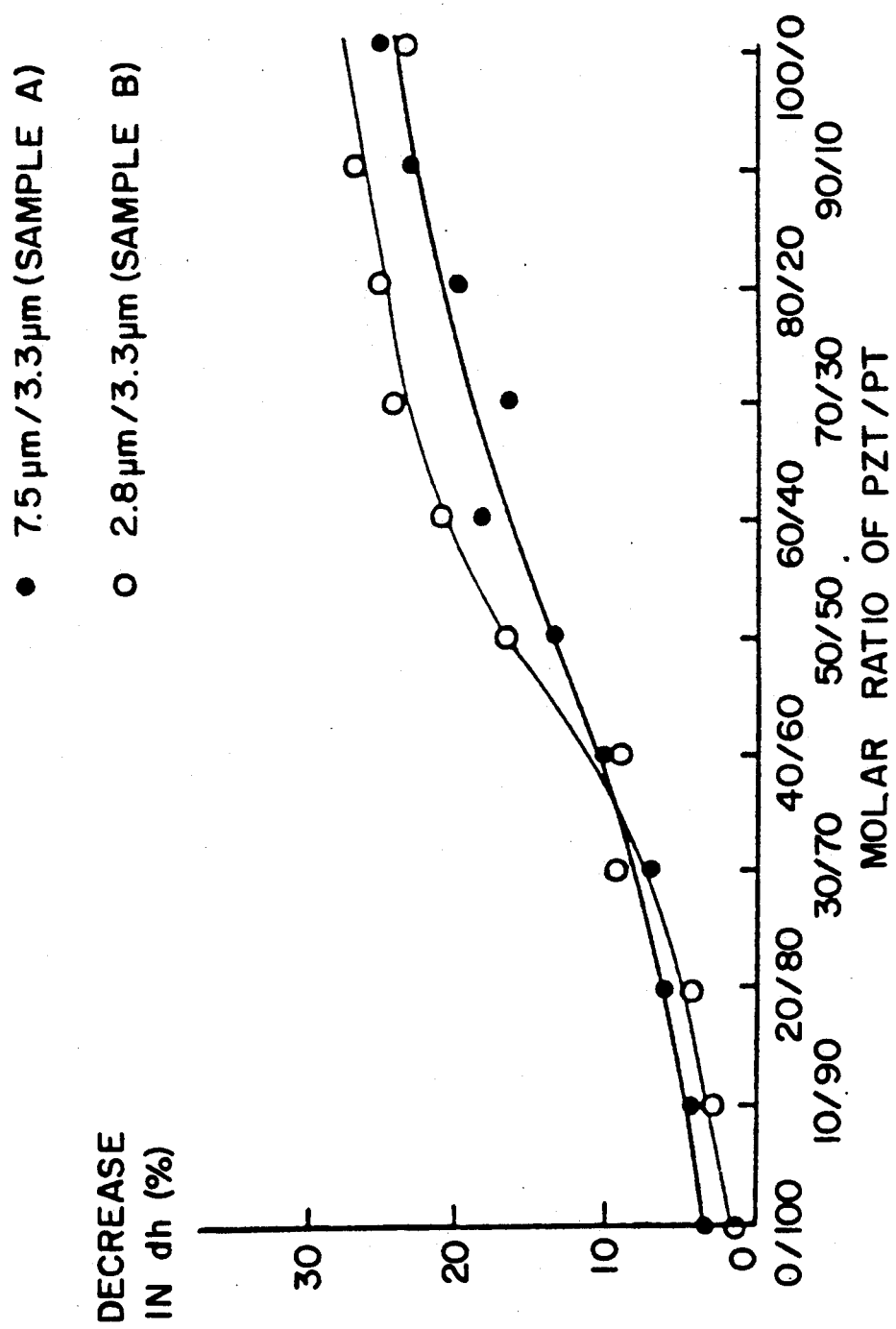
FIG. 3 is a graph showing the relationship between $d_h$ decreasing rate and volume ratio of PZT/PT.

Sample piezoelectric element was immersed in water. The piezoelectric constant $d_h$ was measured while varying the static water pressure form 0.5M Pa to 15 Mpa to determine the decrease (%) of $d_h$. As the samples, those having a ceramic mixture content of 70% were used. The results are summarized in FIG. 3.

TABLE 3

$d_h$ of Piezoelectric Composites Sample B

| Ceramic Mixture | $d_h$ (× $10^{-12}$ C/N) Content of Ceramic Mixture (vol. %) | | | | |
|---|---|---|---|---|---|
| | I | II | III | IV | V |
| No. PZT/PT (vol) | 50 | 60 | 65 | 70 | 75 |
| 12   0:100 | 9.4 | 16.6 | 18.3 | 20.4 | 23.4 |
| 13  10:90 | 11.3 | 13.4 | 17.0 | 23.1 | 22.5 |
| 14  20:80 | 9.4 | 11.2 | 16.3 | 20.4 | 22.8 |
| 15  30:70 | 6.7 | 9.9 | 15.4 | 20.9 | 21.5 |
| 16  40:60 | 6.6 | 6.0 | 13.2 | 16.7 | 19.0 |
| 17  50:50 | 6.2 | 6.2 | 13.7 | 14.3 | 14.8 |
| 18  60:40 | 4.9 | 6.3 | 7.5 | 8.7 | 9.5 |
| 19  70:30 | 3.6 | 5.4 | 7.9 | 8.7 | 8.5 |
| 20  80:20 | 2.9 | 4.7 | 5.5 | 5.4 | 6.9 |
| 21  90:10 | 1.6 | 2.5 | 2.9 | 3.4 | 6.0 |
| 22 100:0 | 0.5 | 0.9 | 2.0 | 1.7 | 2.5 |

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. A piezoelectric composite material comprising:
a matrix of an organic polymer material, and first and second inorganic piezoelectric powders of different chemical composition dispersed in said matrix,
said first inorganic piezoelectric powder having a value of $|d_{31}/d_{33}|$ which is greater than 0.35, said second inorganic piezoelectric powder having a value of $|d_{31}/d_{33}|$ which is not greater than 0.34,
the average particle size of one of said first and second piezoelectric powders being at least two times that of the other,
said first and second piezoelectric powders being present in an amount of 65–75% by volume based on the total volume of said matrix and said first and second piezoelectric powders,
the volume ratio of said first piezoelectric powder to said second piezoelectric powder being in the range of 3:2 to 9:1.

2. A piezoelectric composite material according to claim 1, wherein said first and second piezoelectric powders are present in an amount of 70–75% by volume based on the total volume of said matrix and said first and second piezoelectric powders and the volume ratio of said first piezoelectric powder to said second piezoelectric powder is in the range of 7:3 to 8:2.

3. A piezoelectric composite material according to claim 1, wherein said first piezoelectric powder is lead titanate zirconate powder and said second piezoelectric powder is lead titanate powder.

4. A piezoelectric composite material according to claim 1, wherein the particles of smaller size have an average particle size in the range of 2–5 $\mu$m and the particles of larger size have an average particle size in the range of 4–50 $\mu$m, respectively.

5. A piezoelectric composite material according to claim 1, and in the form of a plate or a tube.

6. A piezoelectric composite material according to claim 1 wherein said first piezoelectric powder is selected from the group consisting of:

$Pb(Zr_{0.52}Ti_{0.48})O_3$ $(Pb_{0.94}Sr_{0.04})(Zr_{0.53}Ti_{0.47})O_3$ $Pb_{0.988}(Zr_{0.52}Ti_{0.48})_{0.976}Nb_{0.024}O_3$ $0.65Pb(Mg_{1/3}Nb_{2/3})O_3$-$0.35PbTiO_3$ $Pb_{0.58}Ba_{0.42}Nb_2O_6$ $(Na_{0.5}K_{0.5})NbO_3$ (hot press)

$BaTiO_3$ and said second piezoelectric powder is selected from the group consisting of:

$(Pb_{0.76}Ca_{0.24}[(Co_{1/2}W_{1/2})_{0.04}Ti_{0.96}]O_3 + 2$ mole % $MnO_2$ $PbTiO_3$ $PbNb_2O_6$ $0.96PbTiO_3$-$0.04La_{2/3}TiO_3 + 1$ mole % $MnO_2$ $(Ba_{0.77}Ca_{0.133}Pb_{0.090})TiO_3$

* * * * *